United States Patent
Cochran et al.

(10) Patent No.: US 7,124,213 B2
(45) Date of Patent: Oct. 17, 2006

(54) DEVICE HAVING SPARE I/O AND METHOD OF USING A DEVICE HAVING SPARE I/O

(75) Inventors: William H. Cochran, Rochester, MN (US); William P. Hovis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 453 days.

(21) Appl. No.: 10/675,420

(22) Filed: Sep. 30, 2003

(65) Prior Publication Data

US 2005/0081125 A1    Apr. 14, 2005

(51) Int. Cl.
  G06F 3/00   (2006.01)
  G06F 3/06   (2006.01)
  G06F 13/14  (2006.01)
(52) U.S. Cl. .......................................... 710/51; 710/38
(58) Field of Classification Search ...................... None
   See application file for complete search history.

(56) References Cited

U.S. PATENT DOCUMENTS 5,680,641 A * 10/1997 Sidman ........................ 710/20
5,909,594 A *  6/1999 Ross et al. .................... 710/20

OTHER PUBLICATIONS

Mano and Kime, Logic and Computer Design Fundamentals, 2000, Prentice-Hall, 2nd edition, pp. 119-122.*

* cited by examiner

Primary Examiner—Kim Huynh
Assistant Examiner—Joshua D. Schneider
(74) Attorney, Agent, or Firm—Patterson & Sheridan

(57) ABSTRACT

A method and apparatus for correcting internally defective devices by routing signals on an I/O line to a spare internal network. Such devices enable a system designer to substitute good internal networks, e.g., memory arrays, for failing internal networks without loss of functionality at the I/O level. A device includes a plurality of I/O lines, a plurality of internal networks, a plurality of multiplexers for routing signals from the individual I/O lines to the individual internal networks, and a multiplex controller for controlling the signal routing. Routing can be performed using multiplexers that operatively interconnect any I/O line with any internal network, multiplexers that shift signals on an I/O line to and adjacent internal network, and/or multiplexers that can shift signals on an I/O through a multiplexer to any other multiplexer, and then to any internal network.

10 Claims, 8 Drawing Sheets

000# DEVICE HAVING SPARE I/O AND METHOD OF USING A DEVICE HAVING SPARE I/O

BACKGROUND OF THE INVENTION

1. Field of the Invention

Embodiments of the present invention generally relate to device architectures. More specifically, the present invention relates to devices, e.g., memory devices, having spare input-output lines and to methods of using such devices.

2. Description of the Related Art

High reliability computers are often required in critical missions for medical, financial, and military applications. Such computers usually include processors and memory devices that manage and manipulate data to achieve mission objectives. Memory devices typically have input-output (I/O) lines that connect to memory "cells" that are organized into arrays. Such memory devices further include support circuitry that can access the individual memory cells by memory addresses and that can WRITE data into and READ data from addressed memory cells. Memory devices are often categorized by how wide their I/O ports are. Common memory device port widths are 4, 8, and 16 lines, which enables 4, 8, or 16 data bits to be input/output at a time.

Due to inherent processing limitations, it is not uncommon for one or more memory cells to be faulty. While a memory device may contain millions of memory cells, if even one memory cell is faulty the memory device is defective. To address this problem some memory device manufacturers have included "redundant" memory cells that can be selectively used to repair faulty primary memory cells. Such repairs have been made by selectively activating "fuses" that are disposed in the memory device. Whenever a fuse is opened, routing logic accesses a redundant memory cell or array of redundant memory cells instead of the defective primary memory cell.

Although redundant memory cells are useful in improving manufacturing yields, even after manufacture memory devices can fail. Most failures are caused by a single bit error that results from the failure of a single memory cell or associated banks of memory cells. Logic is often utilized to detect faulty memory cells, typically during memory initialization e.g., during power-on or following a reset. When a memory cell is found faulty the memory address associated with that memory cell (or cells) is marked as "bad" and not used. Unfortunately, the computer may crash or become unusable until the failed memory device can be replaced. Such problems are simply not acceptable in mission critical systems.

One approach to improving reliability is to implement memory I/O with error correcting Code (ECC) capabilities. While this can greatly enhance reliability by enabling error correction and detection, additional memory to store the error correcting code is required. By using error correction and detection a defect on any particular I/O line can be found and corrected. Error correcting more than one I/O line, while possible, becomes fairly complicated and requires more memory. Typically, error correction is limited to one line while error detection is limited to two lines.

While common memory device port widths are 4, 8, and 16 lines, modern high-end processors have 32 or 64 (or greater) bit wide ports. To accommodate such port widths, memory devices are often arranged into memory modules. FIG. 1 illustrates a typical prior art dual-inline memory module (DIMM) 100 that is used to supply memory for a 64-bit wide processor. The DIMM 100 includes 5 memory devices, the memory devices 102, 104, 106, 108, and 110 that are mounted on a circuit card 112. All of the memory devices are x16 (have 16 I/O lines). All of the I/O lines of the memory devices 102, 104, 106, 108 connect to DIMM contacts 116. Those memory devices provide 64 I/O port connections for the processor (which is not shown). The memory device 110 only connects 8 of its 16 I/O lines to the DIMM contacts 116. As shown, the other 8 I/O lines 120 are unused. Thus, DIMM 100 provides 72 I/O lines while 8 I/O lines are unused and represent wasted potential. While all I/O connections are shown in FIG. 1, in practice both sides of the DIMM 100 have contacts.

Therefore, a system architecture that makes use of unused I/O lines would be beneficial. Also beneficial would be a device architecture that enables a system supplier to make use of all available I/O pins. Also beneficial would be memory devices that enable a system designer to correct a memory system for defects.

SUMMARY OF THE INVENTION

The principles of the present invention provide for devices that can correct for internal defects by routing functions from an I/O line that is associated with an internal network to a redundant internal network. Those principles enable a supplier to provide for devices having spare I/O capacity. In such devices, such spare I/O capacity enables a system designer to swap good memory arrays for failing memory arrays without loss of functionality at the I/O level. An example of a device suitable for practicing the principles of the present invention is a memory device. A memory device that is in accord with the principles of the present invention includes the ability to route I/O signals on a port line that is associated with a failing memory array to and from an unused memory arrays without loss of functionality at the I/O level.

The principles of the present invention provide for devices that have a plurality of I/O lines, a plurality of internal networks (e.g., memory arrays), a plurality of multiplexers for routing signals from the individual I/O lines to the individual internal networks, and a multiplex controller for controlling the signal routing.

In one embodiment of the present invention the multiplex controller and the multiplexers can route signals to and from any I/O line to and from any of the internal networks ("any for any swapping"). Then, any signal to or from an I/O line that is originally associated with a defective internal network can be routed to and from a replacement internal network. If the device is a memory, signals on any I/O line can be routed into any memory array. In such cases, if required, the memory device can undergo a memory scrub in which good data in a defective memory array is moved into a replacement (spare) memory array. After the memory scrub, all READs and WRITEs from and to the I/O port originally associated with the defective memory array can be directed to the replacement memory array. Error correcting codes (ECC) can be used to fix defective data as required.

In another embodiment of the present invention, data from the I/Os are shifted such that the defective internal network is unused. Shifting can be performed by shifting in one or more directions.

In another embodiment of the present invention data to and from the I/Os are routed through one multiplexer to other multiplexers, and then to the internal network.

BRIEF DESCRIPTION OF THE DRAWINGS

So that the manner in which the above recited features of the present invention can be understood in detail, a more particular description of the invention, briefly summarized above, may be had by reference to various embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

The principles of the present invention provide for devices that can correct for defective internal networks by selectively routing signals on I/O lines to and from other internal networks. While the following detailed descriptions of embodiments of the present invention are all directed to memory devices, such embodiments are merely illustrative of the general principals and are not an exhaustive description of the possible ways to use the inventive technique. For example, the principles of the present invention are applicable to other types of devices. Therefore, one skilled in the art would be able to extend these principles to other applications.

Figure 1:
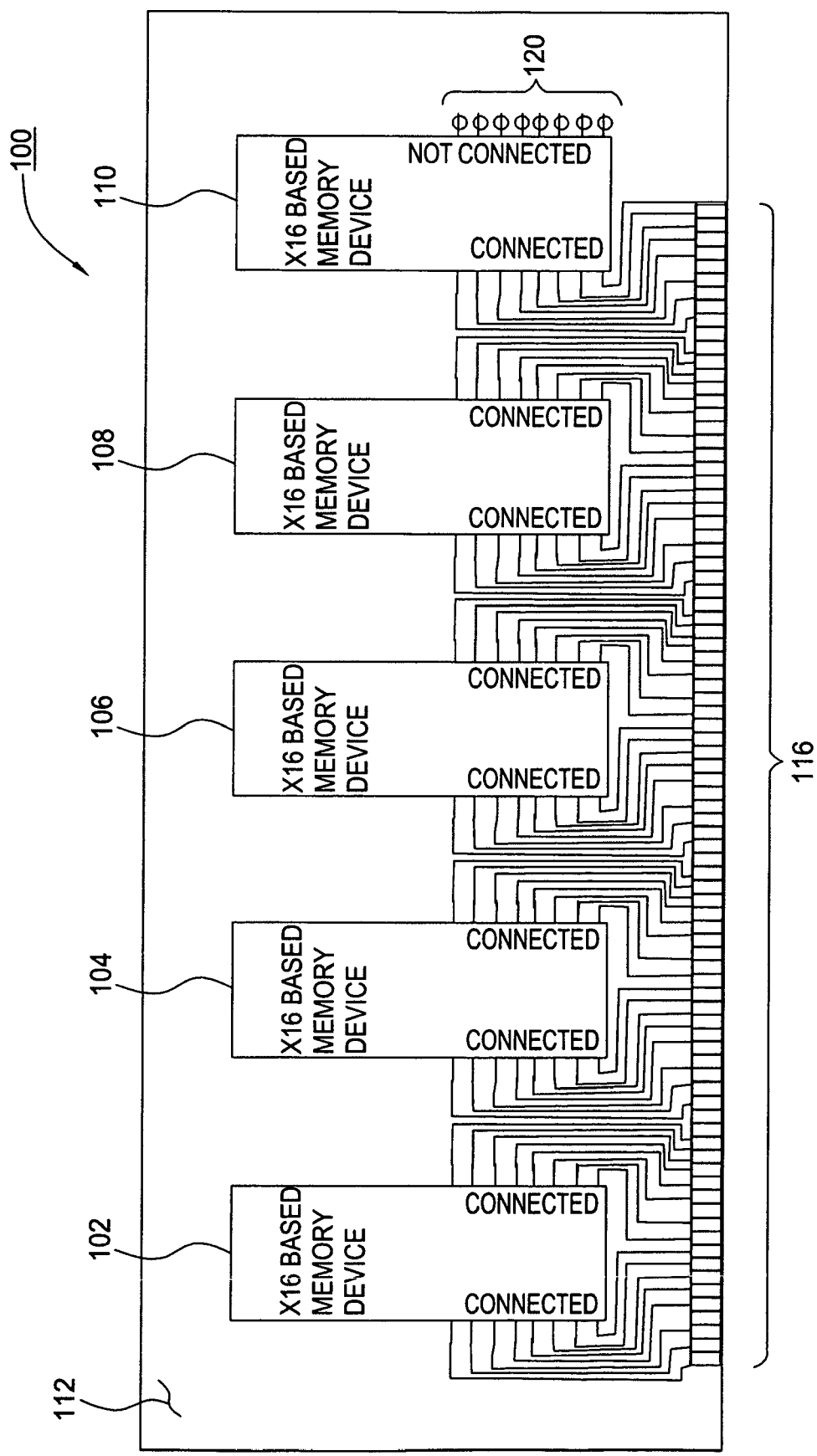
FIG. 1 is a schematic illustration of a conventional DIMM card.
Figure 2:
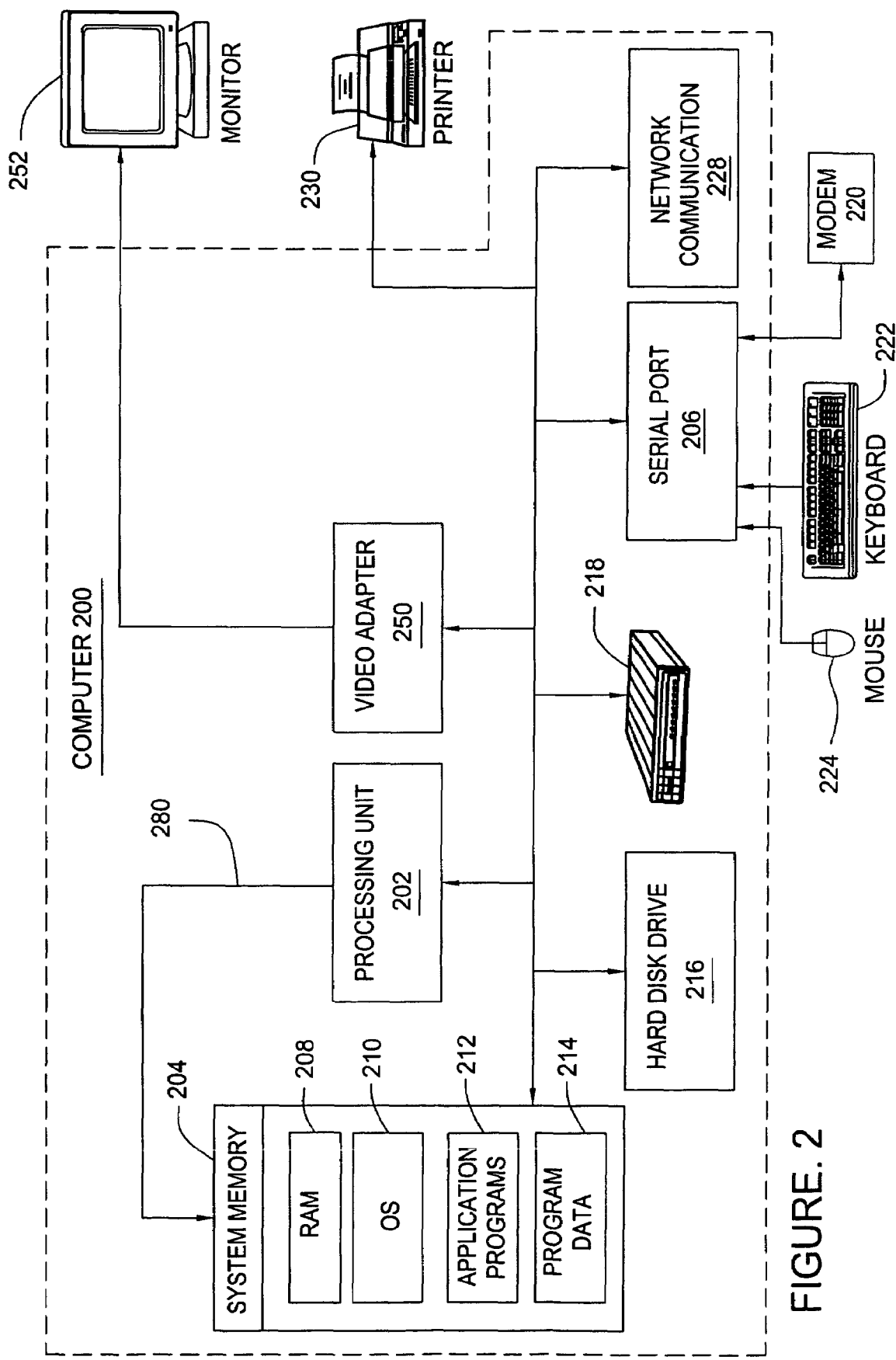
FIG. 2 is a schematic illustration of a computer system that incorporates the principles of the present invention.

FIG. 2 illustrates a computer 200 that incorporates the principles of the present invention. That computer 200 includes a processor 202 that is connected to a system memory 204 via a system bus 206. For purposes of explanation, the processor will be described as having a 64 bit-wide word that communicates along a 72-line system bus 206 to a 72-line I/O system memory 204. Of the 72 I/O lines, 64 are used to represent data and 8 bits are used for error correcting. In general, the processor and the bus will be able to process a W-bit wide word.

The system memory 206 includes random access memory (RAM) 208 that stores an operating system 210, one or more application programs 212, and program data 214. The computer 200 also includes a hard drive 216 and/or an optical drive 218 and/or some other type of non-volatile memory for long-term storage of data. The computer 200 also includes input/output ports for a modem 220, a keyboard 222, a mouse 224, network communication system 228, a video adaptor 250 which drives a monitor 252, and a printer 230.

While the computer 200 can be used for all of the normal functions that computers can be used for, the computer 200 has additionally error correcting capability. That error correcting capability is provided by the system memory 204 and by a control bus 280 that connects the processor 202 to the system memory 204. While the control bus 280 might be part of the system bus 206, they are specially identified because of their importance.

While the computer 200 is shown with a single system memory 204, in practice memory can be associated with almost all of the computer elements. For example, the processor 202 can have local cache memory, as can the printer 230, the video adaptor 250, and many, possibly all, of the other computer elements. Each of those memories can benefit from the principles of the present invention.

Figure 3:
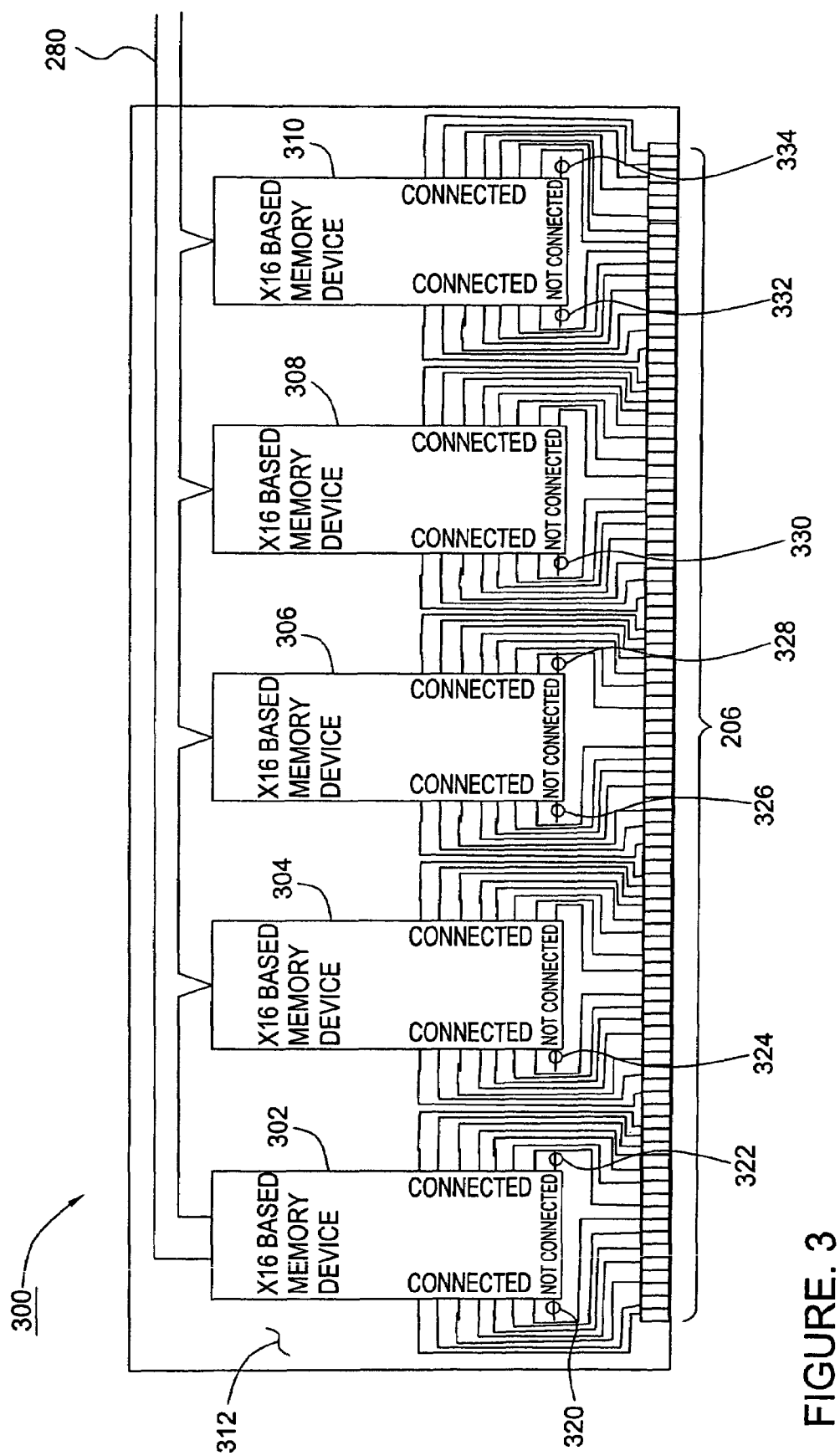
FIG. 3 is a schematic illustration of a DIMM card that is in accord with the principles of the present invention.

The system memory 204 operatively connects to the system bus 206 such that each bus line connects to a memory I/O line. FIG. 3 illustrates a dual-inline memory module (DIMM) 300 that is in accord with the principles of the present invention. The DIMM 300 includes 5 memory devices, the memory devices 302, 304, 306, 308, and 310 that are mounted on a circuit card 312. All of the memory devices are x16 (have 16 I/O lines) and all of the memory devices have I/O lines that operatively connect to the system bus 206. Those I/O lines provide the required 64 I/O connections for the processor 202 and 8 I/O lines for error correction and detection. However, unlike in the DIMM 100, in the DIMM 300 each of its memory devices (302, 304, 306, 308, and 310) has at least one unconnected I/O line. Those unconnected I/O lines are lines 320–334. Additionally, each of the memory devices 302, 304, 306, 308, and 310 connect to the control bus 280. Thus, unlike in the DIMM 100, the unconnected I/O lines of DIMM 300 provide for error correction capability as provided below.

While the DIMM 300 represents a x72 system bus 206 in which 8 lines are unused, if the memory devices were x32 wide devices a x72 system bus would result in 24 unused I/O. If the system bus 206 was a x144 bus, 5 x32 memory devices could be used to drive the x144 interface, resulting in 16 I/O being unused (thus providing 3 or 4 extra I/O per memory device). Therefore, it should be understood that the DIMM 300 is simply an exemplary DIMM.

Figure 4:
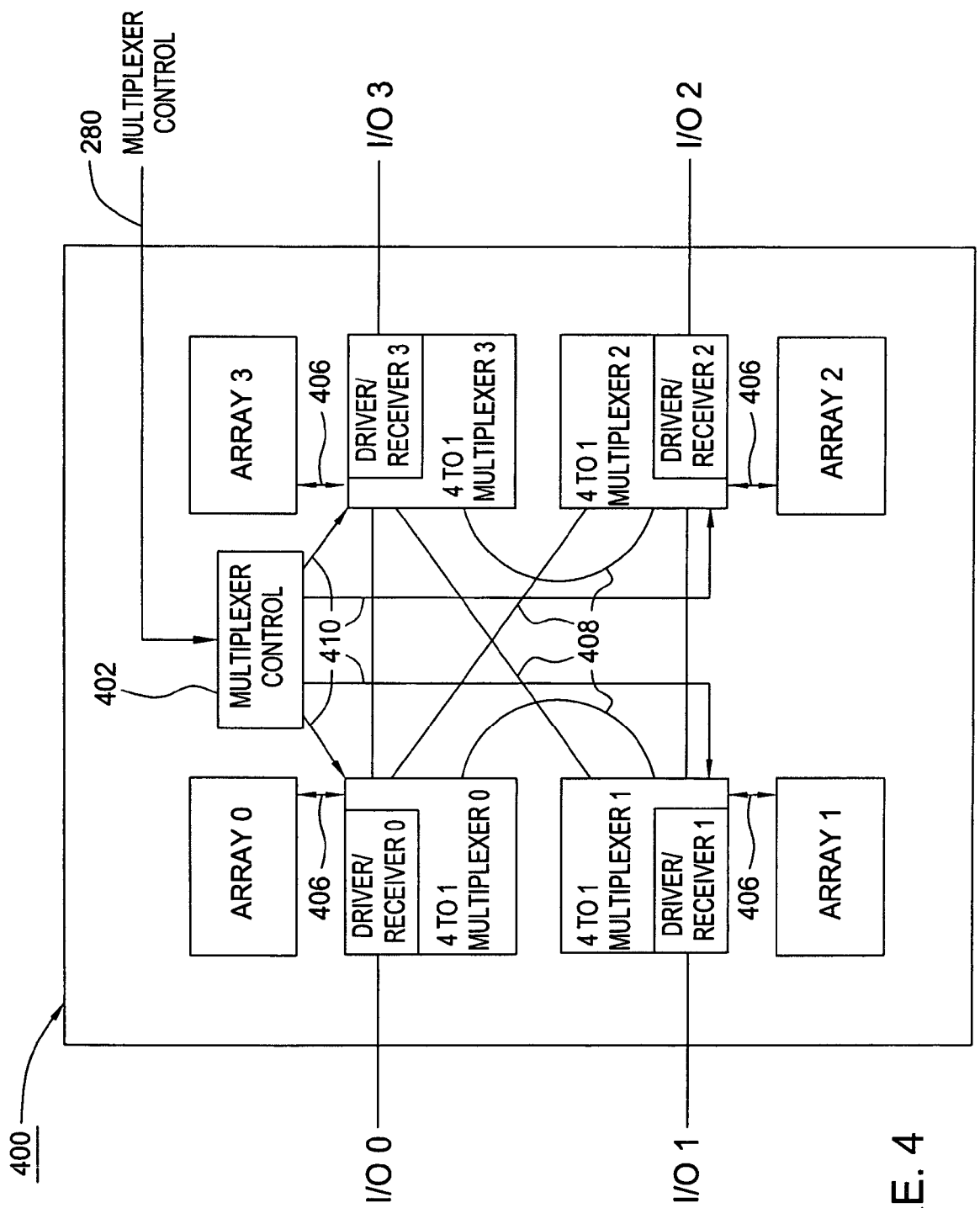
FIG. 4 is a simplified schematic depiction of a first embodiment memory device on the DIMM card of FIG. 3.

The internal organization of the individual memory devices 302, 304, 306, 308, and 310 enable the error correction capability. A first embodiment memory device 400 is illustrated in FIG. 4. As show, that device has four I/O lines, I/O 0, I/O 1, I/O 2, and I/O 3. While for clarity only 4 I/O lines are illustrated, in practice the memory device 400 might include 8, 16, or more I/O lines. Each I/O line connects to a driver/receiver: I/O 0 connects to driver/receiver 0; I/O 1 connects to driver/receiver 1; I/O 2 connects to driver/receiver 2; and I/O 3 connects to driver/receiver 3. In turn, each driver/receiver connects to a 4-to-1 multiplexer: driver/receiver 0 connects to 4-to-1 multiplexer 0; driver/receiver 1 connects to 4-to-1 multiplexer 1; driver/receiver 2 connects to 4-to-1 multiplexer 2; and driver/receiver 3 connects to 4-to-1 multiplexer 3. Each of the 4-to-1 multiplexers connects to an associated array and to all of the other 4-1 multiplexers. Thus, 4-to-1 multiplexer 0 connects to array 0; 4-to-1 multiplexer 1 connects to array 1; 4-to-1 multiplexer 2 connects to array 2; and 4-to-1 multiplexer 3 connects to array 3.

Each of the 4-to-1 multiplexers can route data to or from its associated array (via lines 406), or to any of the other 4-to-1 multiplexers via lines 408. Furthermore, each of the 4-to-1 multiplexers can apply information either from its associated array or from any of the other 4-to-1 multiplexers to its associated I/O line. Routing control is via a multiplex controller 402 that connects to each of the 4-to-1 multiplexers via lines 410. The multiplex controller 402 is controlled by signals from the processor 202 via the bus 280. Thus, the processor 202 can control which of the arrays (array 0 through array 3) each of the I/O lines (I/O 0 though I/O 3) WRITEs data into and READs data from. The memory 400 thus provides for 'any for any' swapping of I/O lines to arrays, and thus any of the I/O lines can be a spare I/O. While a singular spare I/O has been described, the general principles can be extended to multiple spare I/Os.

The operation of the device 400 is best illustrated by example. Assume that array 0 is defective and that I/O 3 is not used (a spare). Then, upon identification of array 0 being defective, the multiplexer control 402 can cause the 4-to-1 multiplexer 0 to route data to and from I/O 0 to and from the 4-to-1 multiplexer 3. The 4-to-1 multiplexer 3 then WRITEs data into and READs data from the array 3. Thus array 3 is substituted for the defective array 0. In such cases, if required, the memory device 400 can undergo a memory scrub in which good data in a defective memory array (array 0) is moved into a spare memory array (array 3). After the memory scrub, all READs and WRITES from and to the I/O port originally associated with the defective memory array are directed to the spare memory array. Error correcting codes (ECC) can be used to fix defective data as required. Scrubbing is beneficially performed by reading from the defective array, performing ECC, and then writing to the substitute array. When scrubbing is complete, all READ and WRITE operations are performed using the substitute array.

Again, while FIG. 4 shows only 4 I/O lines, more than 4 I/O lines are contemplated (but are more complicated to show). In fact, in general N, where N is an integer greater than 2, of I/O lines can be used. Then, following the example of the embodiment of FIG. 4, the N multiplexers are each N-to-1 multiplexers, and each connects to (N−1) other multiplexer and to a local array. Furthermore, there are N arrays.

The memory 400 can be configured into memory having more I/O lines in at least two basic ways. First, additional I/O lines (e.g. I/O 4–I/O 7) could be added, the multiplexers can be configured as 8-to-1 multiplexers, all of the 8-to-1 multiplexers can be connected to each other, and the multiplex controller 402 can be expanded to control all 8-to-1 multiplexers. This represents a simple expansion of the 4 I/O case to the 8 I/O case. Alternatively, a larger device, say an 8 I/O memory could be formed from two of the memories 400. That case represents a simple cascading of separate memories.

Figure 5:
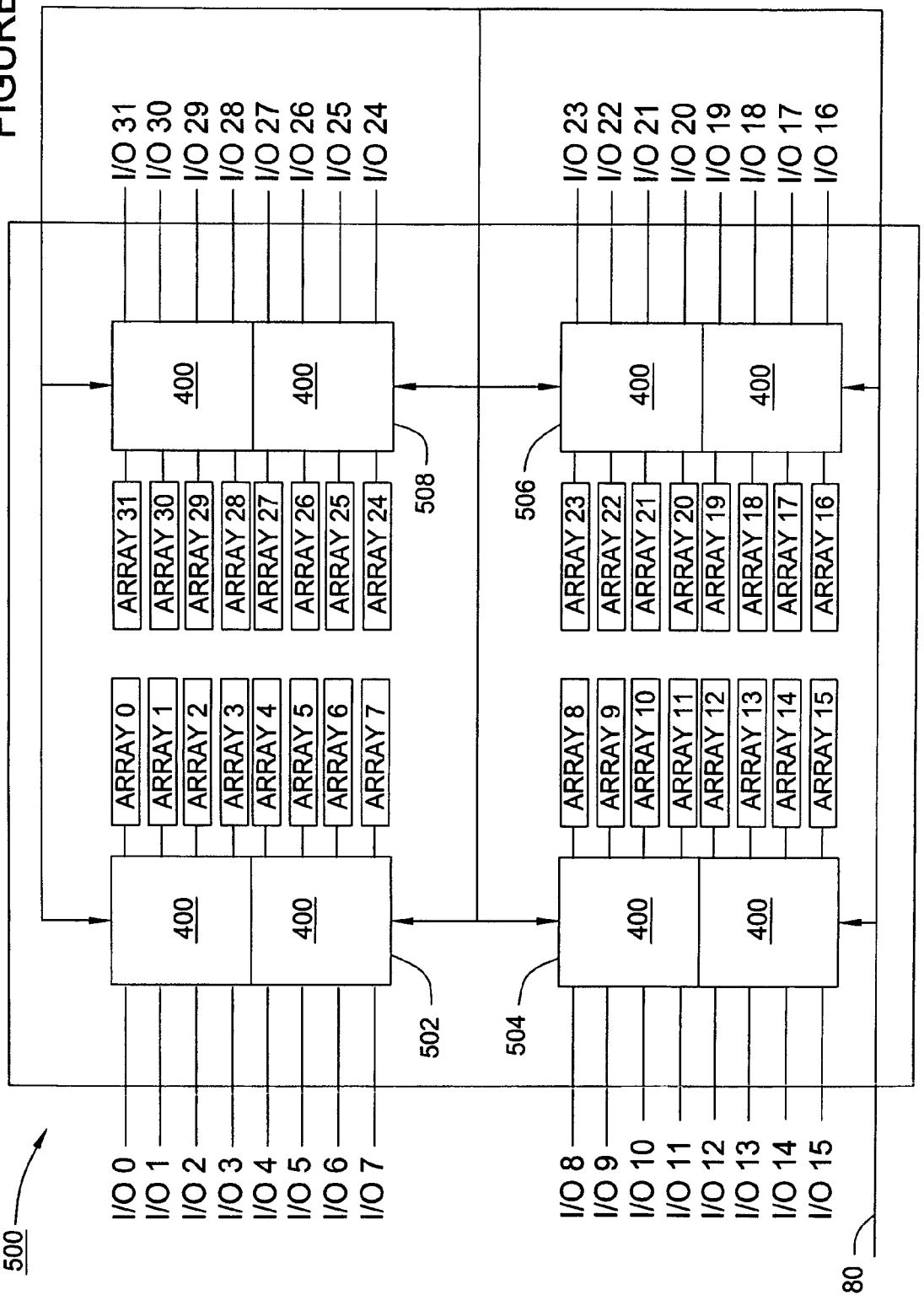
FIG. 5 illustrates 8 of the memories illustrated in FIG. 4 configured to provide a memory having a wider I/O bus.

FIG. 5 illustrates forming a memory 500 having quad 8 I/O lines sub-memories, the sub-memories 502, 504, 506, and 508, so as to provide 32 I/O lines. Each sub-memory is comprised of dual memories 400. The control bus 280 controls each of dual memories 400.

Figure 6:
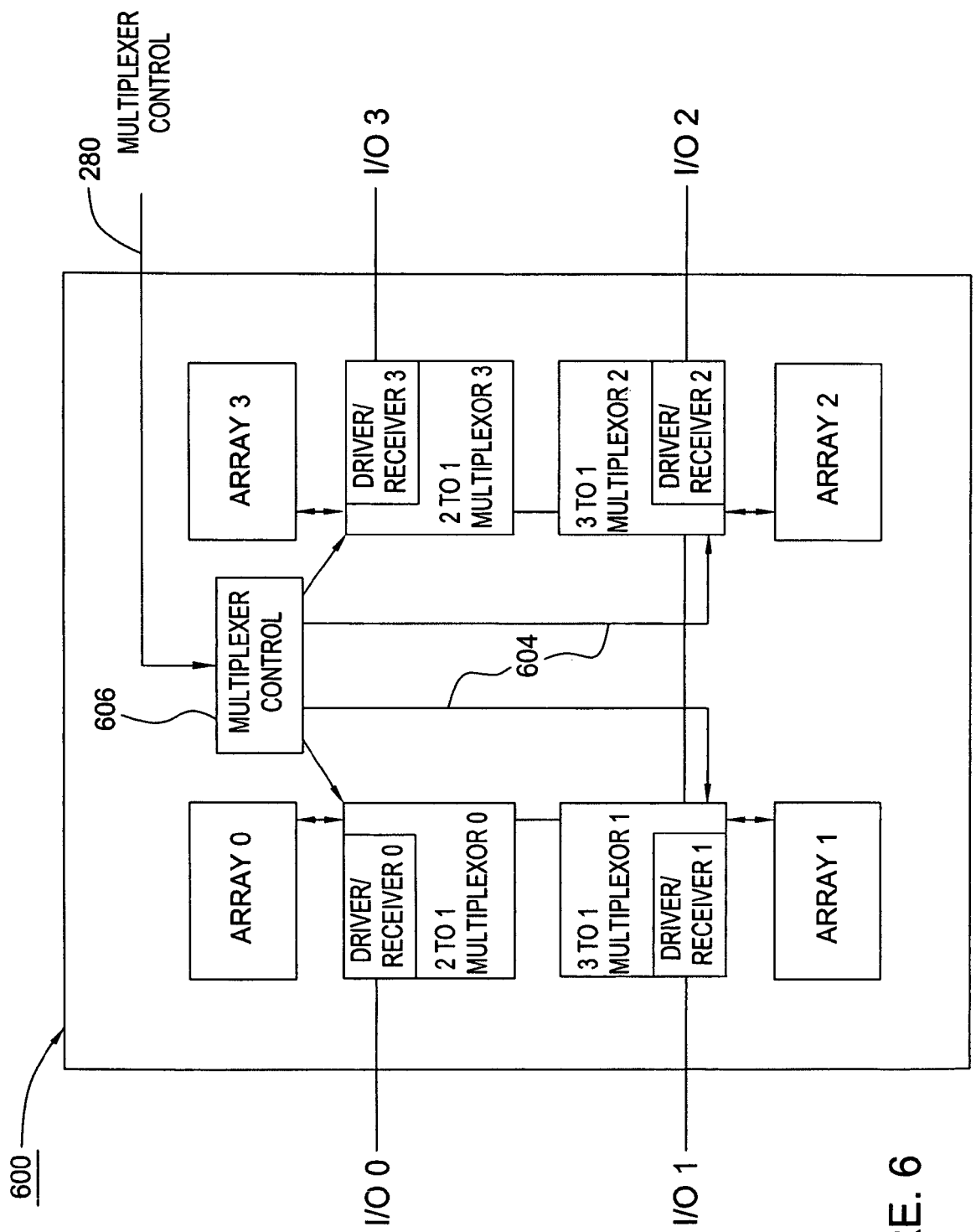
FIG. 6 is a simplified schematic depiction of a second embodiment memory device on the DIMM card of FIG. 3.

While the first embodiment memory 400 is highly beneficial in that it provides great flexibility in routing data into and out of arrays, it can be fairly complex to implement inside a single device. A second embodiment of the present invention is the memory 600 shown in FIG. 6. The memory 600 has four I/O lines, I/O 0, I/O 1, I/O 2, and I/O 3 (this can be expanded to 8, 16, 32 or greater numbers of I/O lines, in general N, where N is an integer). Each I/O line connects to a driver/receiver: I/O 0 connects to driver/receiver 0; I/O 1 connects to driver/receiver 1; I/O 2 connects to driver/receiver 2; and I/O 3 connects to driver/receiver 3. Driver/receiver 0 connects to a 2-to-1 multiplexer 0; driver/receiver 1 connects to a 3-to-1 multiplexer 1; driver/receiver 2 connects to a 3-to-1 multiplexer 2; and driver/receiver 3 connects to a 2-to-1 multiplexer 3. Each multiplexer connects to an associated array, and each receives control signals via lines 604 from a multiplex controller 606. The operation of the multiplex controller 606 is controlled by signals from the processor 202 via the bus 280. Thus, the processor 202 can control the memory 600.

The multiplex controller 606 provides for data shift operations in which data is shifted from one multiplexer to a neighbor. For example, assume that I/O 0 is unconnected in the DIMM 300 (see FIG. 3) and that array 3 is defective. In that case, the data on I/O 3 that would normally be stored in array 3 is shifted by 2-to-1 multiplexer 3 to 3-to-1 multiplexer 2, which then stores the shifted data (from I/O 3) into array 2. Then, the data on I/O 2 that would normally would be stored in array 2 is shifted by the 3-to-1 multiplexer 2 to the 3-to-1 multiplexer 1, which then stores the shifted data (from I/O 2) into the array 1. Finally, the data on I/O 1 that normally would be stored in array 1 is shifted by the 3-to-1 multiplexer 1 to the 2-to-1 multiplexer 0, which stores the shifted data (from I/O 1) into array 0. READ data is shifted the other direction. This shifting reduces the demands on the device multiplexers and on the multiplex controller, but at the cost of numerous shifts. Of course, the memory 600 can be used in place of the memory 400 in the memory 5 shown in FIG. 5.

Although memory 600 is more complicated than memory 400 at the system level, it is easier to implement at the memory device level. The added system level complexity includes tracking at which I/O the shifting begins and where the spare I/O is located. Memory scrubbing, if required, involves additional complexity.

Figure 7:
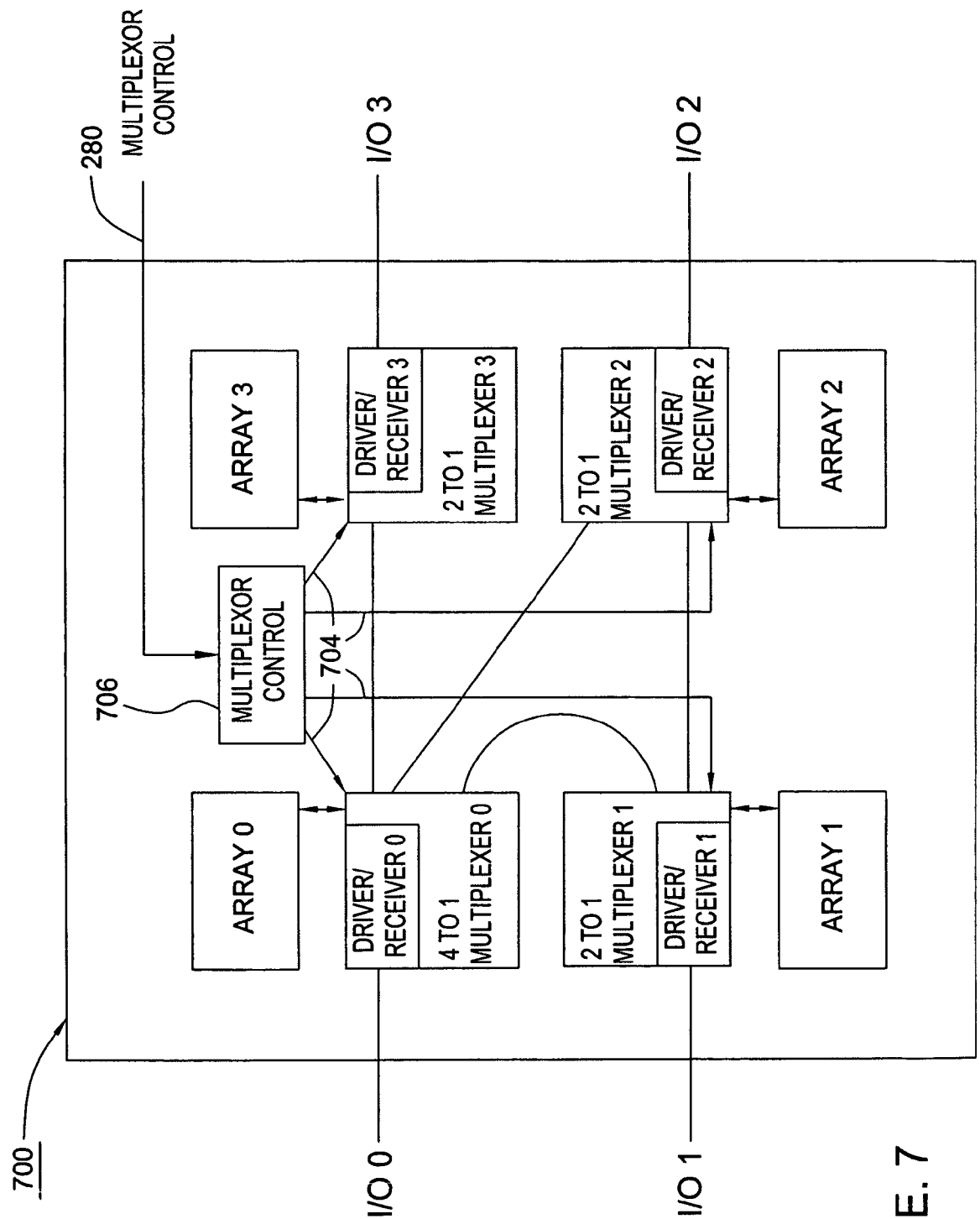
FIG. 7 is a simplified schematic depiction of a third embodiment memory device on the DIMM card of FIG. 3.

FIG. 7 illustrates another memory 700 that is suitable for practicing the principles of the present invention. In this embodiment, I/O 0 is the spare I/O line. The memory 700 has four I/O lines, I/O 0, I/O 1, I/O 2, and I/O 3 (this can be expanded to 8, 16, 32 or greater numbers of I/O lines, in general N I/O lines). Each I/O line connects to a driver/receiver: I/O 0 connects to driver/receiver 0; I/O 1 connects to driver/receiver 1; I/O 2 connects to driver/receiver 2; and I/O 3 connects to driver/receiver 3. Driver/receiver 0 connects to a 4-to-1 multiplexer 0; driver/receiver 1 connects to a 2-to-1 multiplexer 1; driver/receiver 2 connects to a 2-to-1 multiplexer 2; and driver/receiver 3 connects to a 2-to-1 multiplexer 3. Each multiplexer connects to an associated array, and each receives control signals via lines 704 from a multiplex controller 706. Furthermore, each 2-to-1 multiplexer connects to the 4-to-1 multiplexer 0. The operation of the multiplex controller 706 is controlled by signals from the processor 202 via the bus 280. Thus, the processor 202 controls the memory 700.

The multiplex controller 706 provides for data steering operations in which data can be steered from or to the 4-to-1 multiplexer 0. For example, with I/O 0 unconnected in the DIMM 300 (see FIG. 3), assume that array 1 is defective. In that case, the data on I/O 1 that normally would be stored in array 1 is steered by the 2-to-1 multiplexer 1 to the 4-to-1 multiplexer 0. In turn, the 4-to-1 multiplexer 0 steers the data from I/O 1 to array 0. Data is READ by steering in the reverse direction. This system reduces the demands on the device multiplexers and on the multiplex controller, but at the cost of multiple bits being handled, albeit with fewer bit handling steps than with the memory 600. Of course, the memory 700 can be used in place of the memory 400 in the memory 5 shown in FIG. 5.

Figure 8:
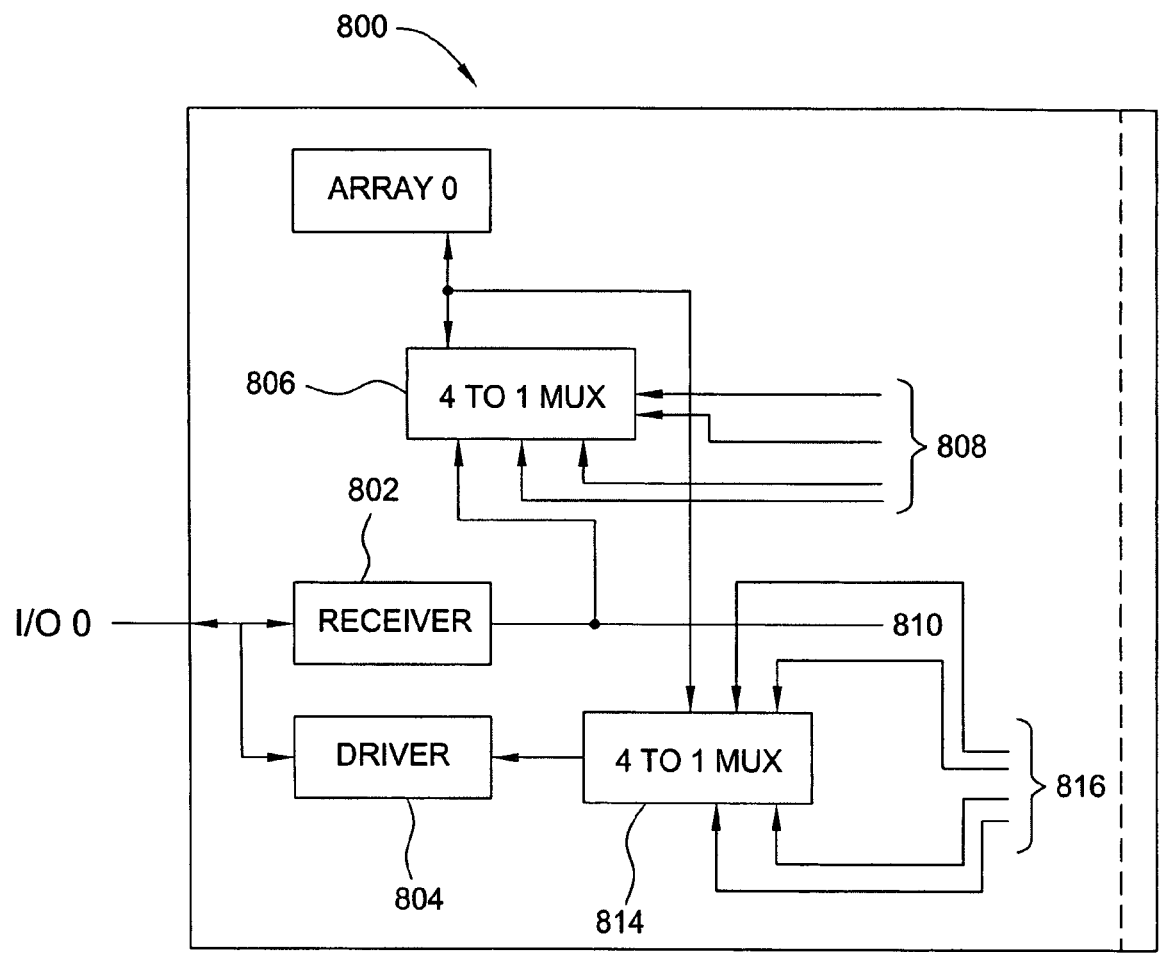
FIG. 8 is a simplified depiction of a memory system in which READ and WRITE signal paths are separated at the I/O lines.

The foregoing has been described using a single multiplexer on each I/O line. However, there are other ways to implement multiplexing. For example, FIG. 8 shows a simplified depiction of a memory system 800 in which READ and WRITE signal paths are separated at the I/O lines. While FIG. 8 shows only one I/O line, it should be understood that each I/O line of the memory system 800 can use READ and WRITE path splitting. As shown, the I/O 0 line is applied to a receiver 802 and to a driver 804. The receiver 802 sends it signals to a receiver multiplexer 806. For simplicity, it is assumed that the receiver multiplexer 806 is a 4-to-1 multiplexer. The receiver multiplexer 806 connects to the receiver 802, to an Array 0, and to the other receivers and to a multiplexer controller (which are not shown for clarity) via buses 808. Signals to be stored in the Array 0 are routed through the receiver multiplexer 806. Furthermore, the receiver 802 also connects to the other multiplexers via a bus 810.

Still referring to FIG. 8, the driver 804 connects to a driver multiplexer 814. The driver multiplexer 814 connects to the other arrays and to the multiplexer controller (which are not shown for clarity) via busses 816. The driver multiplexer 814 also connects to the Array 0.

The operation of the system 800 is straightforward. When a WRITE signal is applied to I/O 0, the receiver 802 sends that WRITE signal to its receiver multiplexer 806 and to the other receiver multiplexers. The multiplexer controller then controls which array stores the WRITE signal on I/O 0. If Array 0 is to store the WRITE signal, the receiver multiplexer 806 writes information into Array 0. During a READ, the multiplex controller determines which Array is to be read from. Assuming that I/O 0 is to send the read data, that data is routed through the driver multiplexer 814 to the driver 804. If data is being read from Array 0, that information is directly applied to the driver multiplexer 814. Otherwise, alternate array data is steered directly to the driver 804. Having dedicated multiplexers for the READ and WRITE paths avoids problems associated with having a single multiplexer handle both paths, e.g., having to worry about bi-directional drivers and their required control.

A common theme of the various embodiments of the present invention is the use of spare I/O lines, lines that exist in many systems and that consequently go unused, and spare internal networks (such as memory arrays). By distributing the spare I/O lines across multiple devices, and by incorporating internal multiplex controllers and internal multiplexers, signals to and from defective internal networks can be re-routed to functional internal networks. For example, data that would normally go to a defective memory array can be re-routed to a functional array. It should be noted that no additional I/O lines are required. In the case of memory devices, the present invention can be made fully compatible with existing ECC schemes, including those that use conventional sparing techniques. Additionally, devices that are in accord with the principles of the present invention can "repair" internal defects. In practice a complex system can remain fully functional when it would normally crash because of a device defect. All this capability is made available by a small amount of additional logic.

While the foregoing has described swapping entire arrays when a fault occurs, with additional logic it is possible to segment an array's address space such that sparing is done on a partial array basis (½ the address space, ¼ the address space, on a logical bank by logical bank basis, etc.). With such capability, a "defective" array could be used until the fault address, and then data can be steered to a spare array. Furthermore, one spare array could be used to store data swapped into it from multiple defective arrays. This will require a multiplex controller and a processor that dynamically steer signals depending upon the address of the command.

When implementing a system that uses the principles of the present invention the designated spare I/O lines must be identified. Identification can be accomplished at design time, by testing, or by programming, e.g., mode register (MRS or EMRS in industry nomenclature) programming such as is required by many industry standard memory devices today (SDR SDRAM, DDR SDRAM, etc.). The MRS/EMRS command could be followed at a deterministic time later (3, 4, 5, cycles) where all connected data pins would be toggled (0101 or 1010 pattern). All pins toggling would be identified as 'not spare' (the default state perhaps), and all I/O remaining static as spare. Conversely spare I/O could intentionally be tied low and all connected I/O could be driven high for identification as well. In either case, the spare/not spare I/O information is saved for each device. Devices that don't have this function used would have all I/O identified as not spare, which would prevent them from being spared out in subsequent swap commands/sequences. If multiple spare I/O lines exist, the order of replacement could be as simple as low order for first repair, next lowest order for 2nd repair, and so on. The control multiplexer could simply change the steering at the I/O to be replaced such that the first (or only) spare I/O array is used.

The principles of the present invention also enable fault isolation. For example, assume that a system has detected a memory fault on an I/O. If the memory array output is moved such that the contents of the array associated with the I/O fault is output on another I/O and the data on that other I/O still reads in error, then the fault is with the array. However, if the swap causes the data to be successfully read, then the fault is somewhere in the electrical path associated with the driver/receiver, or the I/O port.

While the foregoing is directed to embodiments of the present invention, other and further embodiments of the invention may be devised without departing from the basic scope thereof, and the scope thereof is determined by the claims that follow.

The invention claimed is:

1. A computer system, comprising:
   a processor having at least W I/O lines;
   a bus for transferring at least W I/O bits to and from said processor;
   a memory module attached to said bus, said memory module for storing and saving a W-bit wide word, wherein said W-bit wide word is applied to said bus, wherein said memory module is comprised of a plurality of memory devices having more than W I/O lines, wherein at least one memory device has a spare I/O line that is not connected to said bus, and wherein said at least one memory device includes;
   said spare I/O line;
   N–1 I/O lines, wherein N is an integer;
   N addressable arrays, at least one of which is associated with said spare I/O line;
   N multiplexers for routing signals from said N–1 I/O lines and from said spare I/O line to said addressable arrays in response to control signals; and
   a multiplex controller for producing said control signals;
   wherein data on at least one of said N–1 I/O lines can be stored in and/or read from said array associated with said spare I/O line.

2. A computer according to claim 1, wherein at least one multiplexer is an N-to-1 multiplexer.

3. A computer according to claim 2, wherein at least one multiplexer is a 2-to-1 multiplexer.

4. A computer according to claim 3, wherein at least one multiplexer is a 3-to-1 multiplexer.

5. A computer according to claim 1, wherein at least one multiplexer can mute signals to an associated array.

6. A computer according to claim 1, wherein at least one multiplexer shifts signals on an I/O line to an adjacent multiplexer.

7. A memory module for storing and saving a W-bit wide word applied to a bus, comprising:
an interface for communicating with the bus; and
a plurality of memory devices having more man W I/O lines, wherein at least one memory device has a spare I/O line that is not connected to said bus, and wherein said at least one memory device includes:
said spare I/O line;
N–1 I/O lines, wherein N is an integer
N addressable arrays, at least one of which is associated with said spare I/O line:
N multiplexers for routing signals from said N–1 I/O lines and from said spare I/O line to said addressable arrays in response to control signals; and
a multiplex controller for producing said control signals;
wherein data on at least one of said N–1 I/O line can be stored in and/or read from said array associated with said spare I/O line.

8. A memory module according to claim 7. wherein, within the at least one memory device:
N N-to-1 multiplexers are used;
each N-to-1 multiplexer may route data to or from any of the other N-to-1 multiplexers;
each N-to-1 multiplexer may route data to or from its associated array; and
each N-to-1 multiplexer may apply data to its associated I/O line.

9. A memory module according to claim 7, wherein, within the at least one memory device:
2 2-to-1 multiplexers and N–2 3-to-1 multiplexers are used: the multiplexers are connected in series with the 3-to-1 multiplexers connected between 2-to-1 multiplexers; each 2-to-1 multiplexer may mute data to or from its neighboring multiplexer; each 3-to-1 multiplexer may mute data to or from any of its neighboring multiplexers;
each multiplexer may route data to or from its associated array; and
each multiplexer may apply data to its associated I/O line.

10. A memory module according to claim 7, wherein, within the at least one memory device:
one N-to-1 multiplexer and N-1 2-to-1 multiplexers are used:
each 24-to-1 multiplexer may mute data to and from the N-to-1 multiplexer;
the N-to-1 multiplexer may mute data to and from any 2-to-1 multiplexer;
each multiplexer may route data to or from its associated array; and
each multiplexer may apply data to its associated I/O line.

* * * * *